(12) United States Patent
Kimura et al.

(10) Patent No.: US 12,401,111 B2
(45) Date of Patent: Aug. 26, 2025

(54) ANTENNA

(71) Applicant: Mitsubishi Electric Corporation, Tokyo (JP)

(72) Inventors: Makoto Kimura, Tokyo (JP); Yukinobu Tarui, Tokyo (JP); Shunichi Abe, Tokyo (JP); Takumi Nagamine, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 113 days.

(21) Appl. No.: 18/562,837

(22) PCT Filed: May 26, 2021

(86) PCT No.: PCT/JP2021/019909
§ 371 (c)(1),
(2) Date: Nov. 21, 2023

(87) PCT Pub. No.: WO2022/249310
PCT Pub. Date: Dec. 1, 2022

(65) Prior Publication Data
US 2024/0266715 A1   Aug. 8, 2024

(51) Int. Cl.
*H01Q 1/22*   (2006.01)
*H01L 23/12*   (2006.01)
(Continued)

(52) U.S. Cl.
CPC ......... *H01Q 1/2283* (2013.01); *H01L 23/367* (2013.01); *H01L 25/105* (2013.01);
(Continued)

(58) Field of Classification Search
CPC ..... H01L 23/36; H01L 23/367; H01L 23/552; H01L 23/66; H01L 25/00; H01L 25/10;
(Continued)

(56) References Cited

U.S. PATENT DOCUMENTS 8,330,273 B2 * 12/2012 Brunnbauer ............ H01L 24/97
257/777
9,577,314 B2 * 2/2017 Liu ....................... H01Q 1/2283
(Continued)

FOREIGN PATENT DOCUMENTS

GB          2574160 A     11/2019
JP      2001-168268 A      6/2001
(Continued)

OTHER PUBLICATIONS

International Search Report and Written Opinion mailed on Aug. 3, 2021, received for PCT Application PCT/JP2021/019909, filed on May 26, 2021, 9 pages including English Translation.

*Primary Examiner* — Tho G Phan
(74) *Attorney, Agent, or Firm* — XSENSUS LLP

(57) ABSTRACT

A microwave module includes a plurality of microwave devices and a microwave module substrate. Each of the plurality of microwave devices exchanges a signal with a corresponding one of a plurality of antenna elements. The microwave module substrate includes a mounting surface on which the plurality of microwave devices are mounted. The microwave module substrate is electrically connected to each of the plurality of antenna elements. The mounting surface is perpendicular to a plane surface on which the plurality of antenna elements are arrayed.

1 Claim, 3 Drawing Sheets

(51) Int. Cl.
    *H01L 23/367*     (2006.01)
    *H01L 25/10*     (2006.01)
    *H01Q 21/06*     (2006.01)
    *H01L 23/00*     (2006.01)
    *H01L 23/552*     (2006.01)

(52) U.S. Cl.
    CPC ......... *H01Q 21/065* (2013.01); *H01L 23/552* (2013.01); *H01L 24/16* (2013.01); *H01L 2224/16227* (2013.01)

(58) Field of Classification Search
    CPC .................. H01L 25/105; H01L 24/16; H01L 2224/16227; H01L 2223/6677; H01L 23/3121; H01L 23/12; H01L 23/29; H01Q 1/02; H01Q 1/22; H01Q 1/2283; H01Q 21/0025; H01Q 21/06; H01Q 21/061; H01Q 21/065; H01Q 23/00
    See application file for complete search history.

(56) References Cited

U.S. PATENT DOCUMENTS

| | | | |
|---|---|---|---|
| 10,541,464 B2 * | 1/2020 | Khan | H01Q 23/00 |
| 11,482,771 B2 * | 10/2022 | Lampersberger | H01Q 1/3233 |
| 11,870,130 B2 * | 1/2024 | Cho | H01L 21/4857 |

FOREIGN PATENT DOCUMENTS

| | | |
|---|---|---|
| JP | 2003-298332 A | 10/2003 |
| WO | 2018/168391 A1 | 9/2018 |

\* cited by examiner

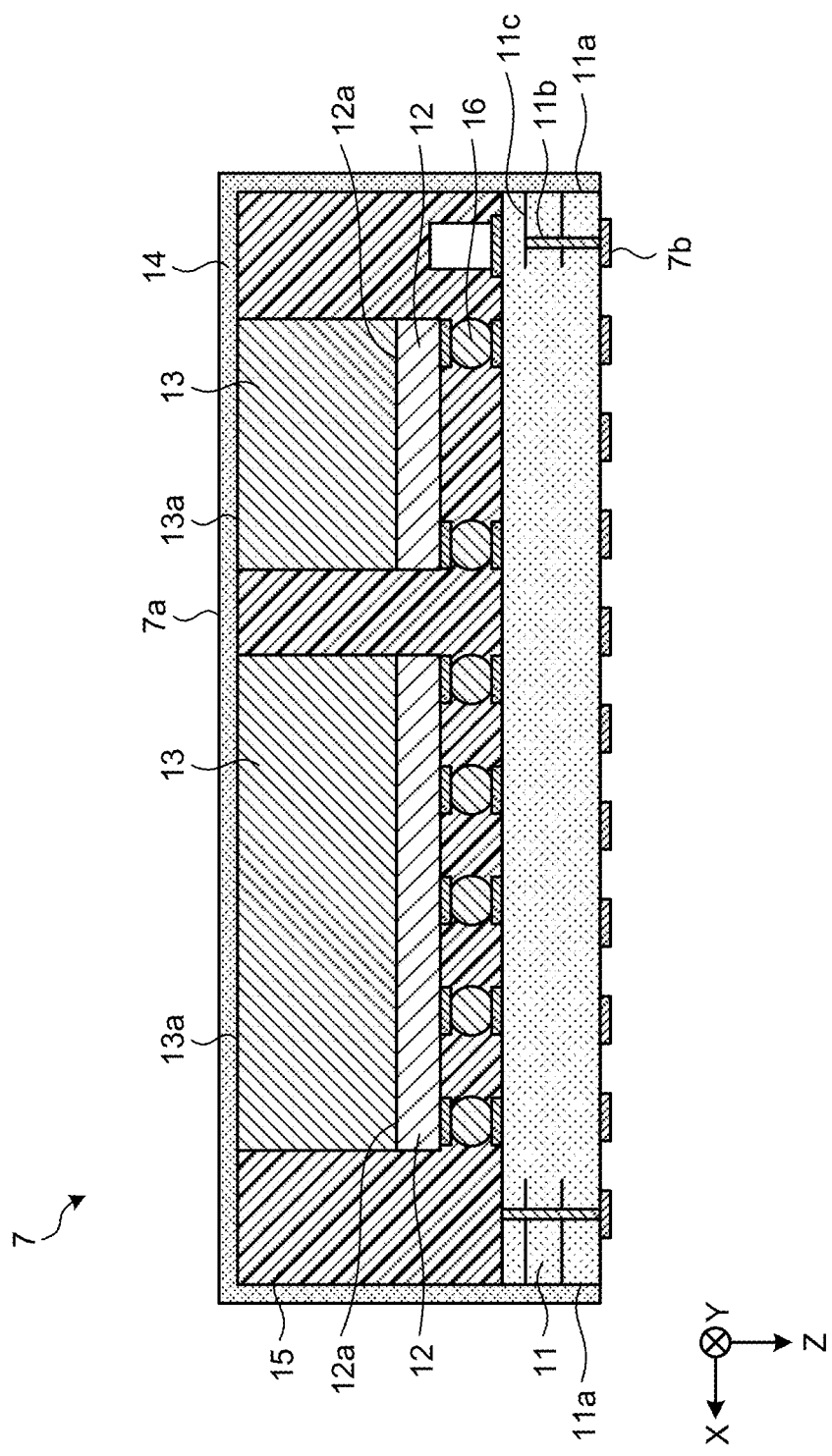

ANTENNA

CROSS-REFERENCE TO RELATED APPLICATION

This application is based on PCT filing PCT/JP2021/019909, filed May 26, 2021, the entire contents of which are incorporated herein by reference.

FIELD

The present disclosure relates to a microwave module and an antenna.

BACKGROUND

In a phased array antenna, which is an antenna, in order to suppress grating lobes, an interval at which antenna elements are arrayed is selected in accordance with a wavelength of a microwave. The interval at which the antenna elements are arrayed is approximately equal to or less than one-half the wavelength of the microwave, resulting in an interval of about 15 mm at 10 GHz and an interval of about 7.5 mm at 20 GHz. The phased array antenna includes, for each antenna element, a microwave device for transmitting and receiving the microwave. A microwave module constituting the antenna includes a plurality of microwave devices.

With an increase in a frequency of the microwave, the antenna has difficulty in arraying the microwave modules at an interval equal to or less than the interval at which the antenna elements are arrayed. For this reason, in an antenna that performs transmission and reception in a frequency band of, for example, Ku band or higher, it is common to connect by wires the antenna elements and the microwave modules with a position of the microwave modules being offset with respect to a position of the antenna elements. However, in this case, the wires between the microwave modules and the antenna elements are long, which causes problems, such as a decrease in transmission power due to power loss and an increase in noise included in received signals, in the wires. Additionally, when an array size of the antenna elements is changed, an offset amount of the microwave modules with respect to the antenna elements changes in accordance with the array size. For this reason, the antenna is difficult to conform to a scalable design and involves large-scale design changes every time the array size is changed, which is problematic. The microwave module is larger in size in a direction of an antenna surface, which is a surface on which the antenna elements are arrayed, than the antenna surface, and thus mountability of the microwave module on the antenna deteriorates, which is also problematic. In order to solve these problems, the microwave module has been desired to be reduced in size in the direction of the antenna surface.

Patent Literature 1 discloses an antenna including a microwave device obtained by integrating main microwave components of a microwave module in one package. In the antenna disclosed in Patent Literature 1, the microwave device is mounted on a substrate disposed in parallel to an antenna surface.

CITATION LIST

Patent Literature

Patent Literature 1: International Publication No. WO 2018/168391

SUMMARY OF INVENTION

Problem to be Solved by the Invention

The conventional technique disclosed in Patent Literature 1 does not allow the microwave device to have a smaller size in the direction of the antenna surface than a planar size of a semiconductor chip inside the microwave device because a surface on which the semiconductor chip is mounted is parallel to the antenna surface. Even with an increase in the frequency of the microwave, it is difficult to reduce the planar size of the semiconductor chip unless output power of the microwave device changes. For this reason, although with an increase in the frequency of the microwave, the interval at which the antenna elements are arrayed is reduced, the conventional technique has difficulty in allowing the microwave module to be reduced in size in the direction of the surface on which the antenna elements are arrayed, which is problematic.

The present disclosure has been made in view of the circumstances, and an object of the present disclosure is to provide a microwave module that can be reduced in size in a direction of a surface on which antenna elements are arrayed.

Means to Solve the Problem

To solve the above problems and achieve the object, a microwave module includes: a plurality of microwave devices each configured to exchange a signal with a corresponding one of a plurality of antenna elements; and a microwave module substrate including a mounting surface on which the plurality of microwave devices are mounted, and being electrically connected to each of the plurality of antenna elements. The mounting surface is perpendicular to a plane surface on which the plurality of antenna elements are arrayed.

Effects of the Invention

The microwave module according to the present disclosure has an effect capable of achieving a reduction in size in the direction of the surface on which the antenna elements are arrayed.

BRIEF DESCRIPTION OF DRAWINGS

FIG. 3 is a cross-sectional view illustrating a microwave device constituting the antenna according to the first embodiment.

DESCRIPTION OF EMBODIMENTS

Hereinafter, a microwave module and an antenna according to an embodiment will be described in detail with reference to the drawings.

First Embodiment

Figure 1:
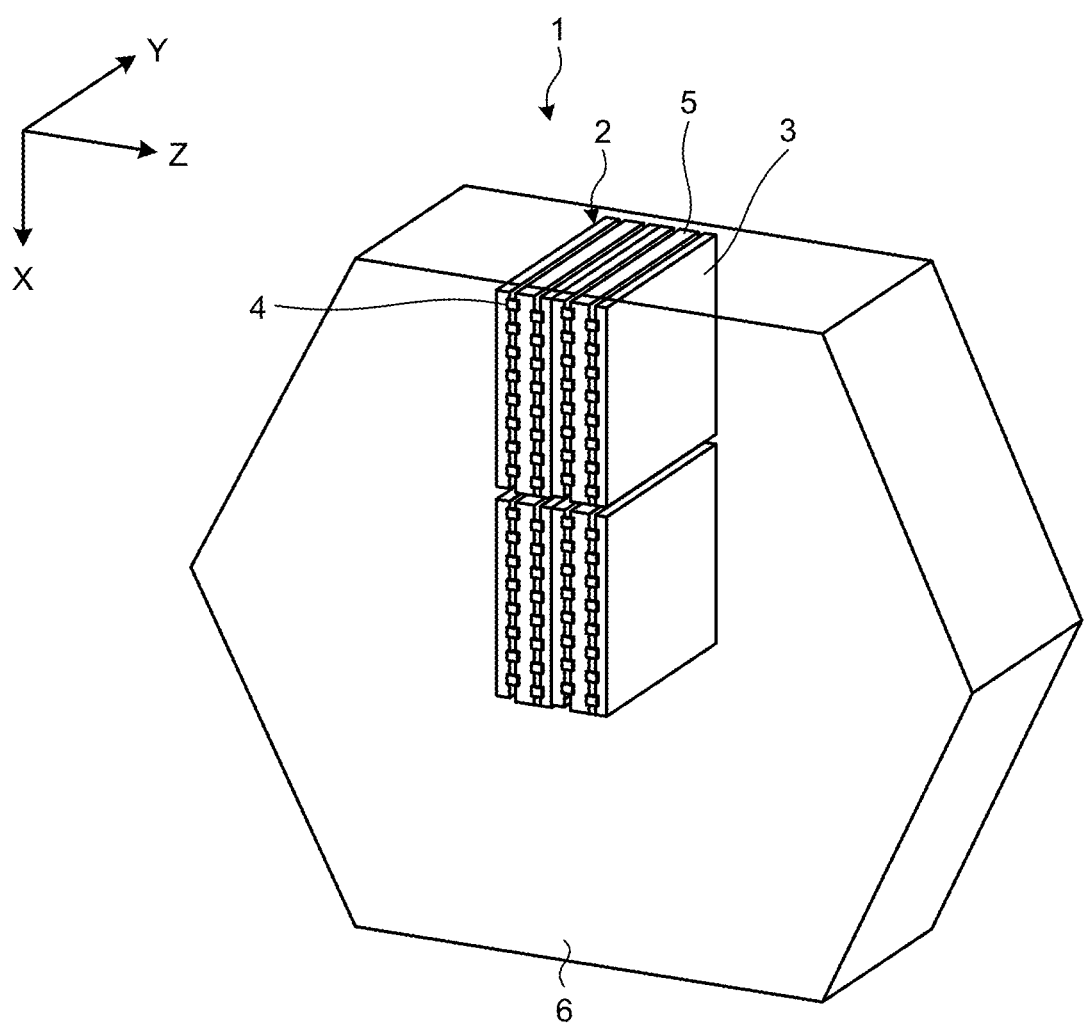
FIG. 1 is a diagram illustrating a configuration of an antenna according to a first embodiment.

FIG. 1 is a diagram illustrating a configuration of an antenna 1 according to a first embodiment. The antenna 1 illustrated in FIG. 1 is an active phased array antenna. FIG.

1 illustrates an X axis, a Y axis, and a Z axis of a three-axis orthogonal coordinate system.

The antenna 1 includes a plurality of antenna elements 4 and a plurality of microwave modules 2. Each of the microwave modules 2 includes a microwave module substrate 3. The plurality of antenna elements 4 are arrayed on an antenna surface 6 that is a common plane surface. The antenna surface 6 is the plane surface that forms an outline of the antenna 1. The antenna surface 6 is an XZ plane including the X axis and the Z axis. The antenna 1 also includes a cooling plate 5 for cooling the microwave modules 2.

The microwave module substrate 3 of each microwave module 2 is disposed perpendicular to the antenna surface 6. The cooling plate 5 is provided between two microwave module substrates 3 facing each other in a Z-axis direction. In FIG. 1, the two microwave module substrates 3 and the cooling plate 5 constitute one set, and each two sets are arrayed in an X-axis direction and the Z-axis direction. That is, FIG. 1 illustrates eight microwave module substrates 3.

The antenna 1 includes the plurality of microwave modules 2 arrayed in a direction of the antenna surface 6. FIG. 1 illustrates eight microwave modules 2 as a part of the plurality of microwave modules 2 included in the antenna 1. FIG. 1 illustrates the outline of the antenna 1, the antenna elements 4, and the microwave module substrates 3 and the cooling plates 5 that are inside the antenna 1.

In FIG. 1, eight antenna elements 4 arrayed in an X-axis direction are connected to each of the microwave modules 2. The antenna elements 4 are disposed at equal intervals. Note that, the number of antenna elements 4 connected to each microwave module 2 is not limited to eight, and can be any number.

The respective antenna elements 4 are electrically connected to the microwave module substrate 3. The antenna elements 4 are connected to a connector provided at an end of the microwave module substrate 3 in a Y-axis direction. The connector is not illustrated. Note that, the respective antenna elements 4 may be provided integrally with the microwave module substrate 3. In this case, the antenna elements 4 and the microwave module substrate 3 are connected near the antenna surface 6.

Figure 2:
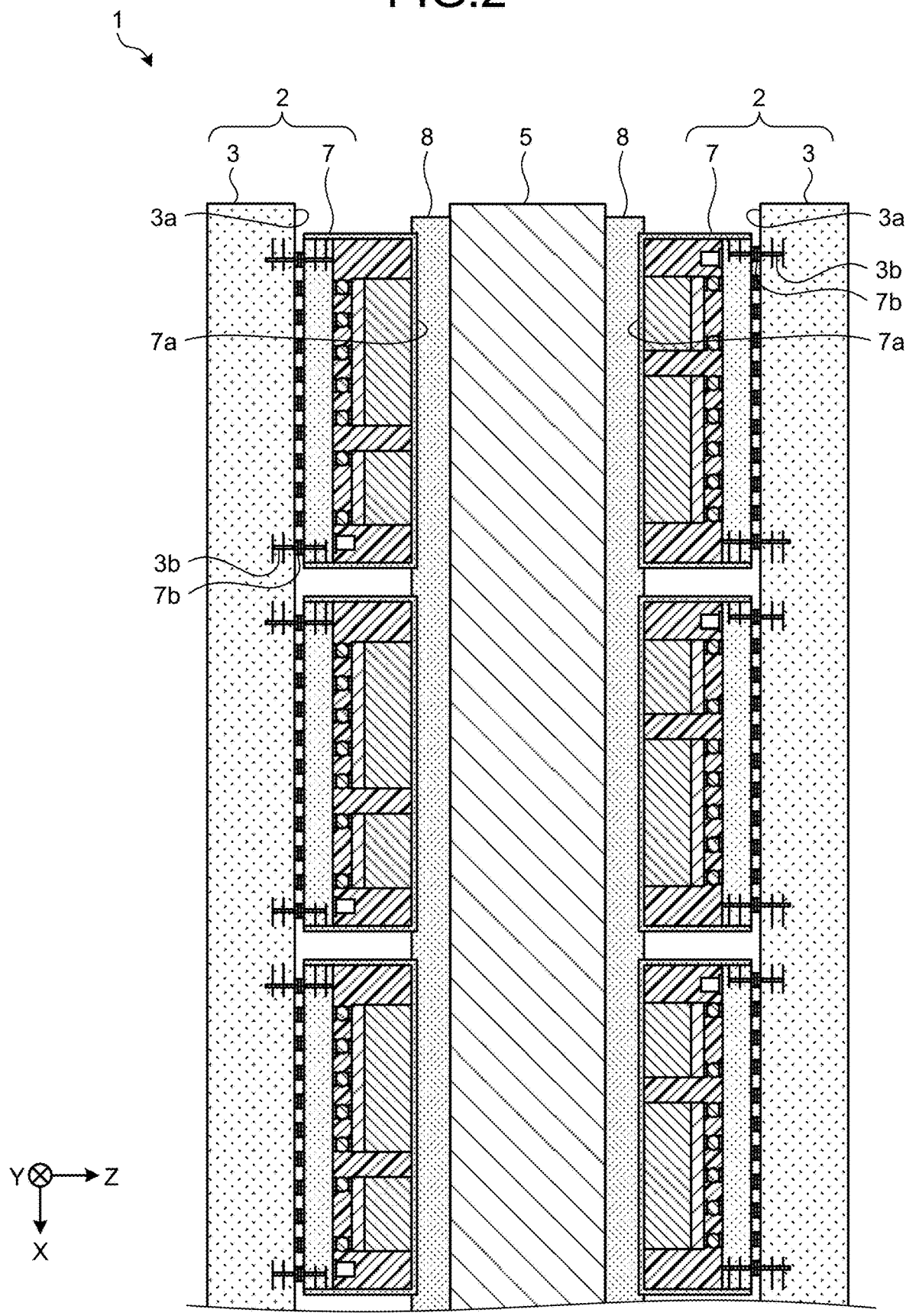
FIG. 2 is a cross-sectional view illustrating a set of microwave module substrates and a cooling plate in the antenna according to the first embodiment.

FIG. 2 is a cross-sectional view illustrating the set of the microwave module substrates 3 and the cooling plate 5 in the antenna 1 according to the first embodiment. The cross section illustrated in FIG. 2 is an XZ cross section including the X axis and the Z axis. The sets each including the microwave module substrates 3 and the cooling plate 5 provided in the antenna 1 each have a similar configuration.

FIG. 2 illustrates the cooling plate 5, two microwave modules 2 facing each other with the cooling plate 5 interposed therebetween, and two heat dissipation sheets 8. In the following description, when the two microwave modules 2 are distinguished from each other, one of the two microwave modules 2 that is illustrated on the left side in FIG. 2 is referred to as a first microwave module, and the other of the two microwave modules 2 is referred to as a second microwave module.

Each of the microwave modules 2 includes a plurality of microwave devices 7. The plurality of microwave devices 7 are arrayed in the X-axis direction. In the microwave module 2, each of the plurality of microwave devices 7 is mounted on the microwave module substrate 3. The microwave device 7 is obtained by integrating main microwave components of the microwave module 2 in one package. The microwave module 2 includes the microwave devices 7 as many as the antenna elements 4 connected to the microwave module 2. Each of the plurality of microwave devices 7 of the microwave module 2 exchanges a signal with a corresponding one of the plurality of antenna elements 4.

Each of the first microwave module and the second microwave module includes eight microwave devices 7 arrayed in the X-axis direction. FIG. 2 illustrates a portion of the first microwave module where three of the microwave devices 7 are provided and a portion of the second microwave module where three of the microwave devices 7 are provided.

The microwave module substrate 3 of each microwave module 2 includes a mounting surface 3a on which the microwave devices 7 are mounted. The mounting surface 3a is an XY plane including the X axis and the Y axis. That is, the mounting surface 3a is perpendicular to the antenna surface 6.

The first microwave module is disposed such that the plurality of microwave devices 7 of the first microwave module face the second microwave module. The second microwave module is disposed such that the plurality of microwave devices 7 of the second microwave module face the first microwave module. Thus, the first microwave module and the second microwave module face each other. The cooling plate 5 is sandwiched between the plurality of microwave devices 7 of the first microwave module and the plurality of microwave devices 7 of the second microwave module. Heat generated in the microwave module 2 propagates to the cooling plate 5, whereby the microwave module 2 is cooled. The first microwave module and the second microwave module are cooled by the common cooling plate 5.

One of the two heat dissipation sheets 8 illustrated in FIG. 2 is sandwiched between the first microwave module and the cooling plate 5. The other of the two heat dissipation sheets 8 is sandwiched between the second microwave module and the cooling plate 5. The heat dissipation sheet 8 is a sheet having low thermal resistance and high elasticity. An example of the material of the heat dissipation sheet 8 includes silicon rubber in which a highly thermally conductive material such as carbon or silver is embedded. The heat dissipation sheet 8 may be a sheet in which a liquid or a gel-like heat dissipation medium is sealed.

The heat dissipation sheet 8 is in contact with contact surfaces 7a that are surfaces of the microwave devices 7 on a side opposite to the microwave module substrate 3. The respective microwave devices 7 mounted on the microwave module substrate 3 are pressed against the heat dissipation sheet 8. The heat dissipation sheet 8 absorbs differences in height of the contact surfaces 7a of the respective microwave devices 7 in the Z-axis direction. Additionally, the heat dissipation sheet 8 allows heat of the microwave devices 7 to efficiently propagate to the cooling plate 5. The microwave devices 7 of the first microwave module and the microwave devices 7 of the second microwave module are thermally connected to the cooling plate 5 via the heat dissipation sheet 8. Thus, the antenna 1 can efficiently cool the first microwave module and the second microwave module.

The microwave module substrate 3 and the microwave devices 7 are electrically connected by solder bonding in a Land Grid Array (LGA) or a Ball Grid Array (BGA) in which microwave signal terminals, control terminals, and ground terminals are arrayed. Each of the microwave devices 7 includes ground terminals 7b electrically connected to ground via holes 3b of the microwave module substrate 3.

The ground terminals 7b of the microwave device 7 are electrically connected to an electromagnetic shield film covering the microwave devices 7. Details of the electromagnetic shield film will be described later. As the ground terminals 7b of the microwave device 7 is connected to the ground via holes 3b of the microwave module substrate 3, radiation of a microwave signal from the microwave device 7 is suppressed. Consequently, the microwave module 2 dispenses with a structure such as a housing or a partition for preventing electromagnetic interference between the microwave devices 7, and achieves a reduction in the electromagnetic interference between the microwave devices 7 with a simple configuration.

FIG. 3 is a cross-sectional view illustrating the microwave device 7 constituting the antenna 1 according to the first embodiment. The cross section illustrated in FIG. 3 is the XZ cross section. The respective microwave devices 7 of each microwave module 2 in the antenna 1 each have a similar configuration.

The microwave device 7 illustrated in FIG. 3 includes: a multilayer substrate 11; semiconductor chips 12, which are semiconductor elements; heat sinks 13; an electromagnetic shield film 14; and a mold resin 15. The microwave device 7 includes two semiconductor chips 12. The number of semiconductor chips 12 included in the microwave device 7 is not limited to two, and can be any number. Each semiconductor chip 12 is a high-frequency circuit and is a main heat source in the microwave device 7.

The semiconductor chips 12 are flip-chip mounted on the multilayer substrate 11. The semiconductor chips 12 are electrically connected to the multilayer substrate 11 via solder 16. Each semiconductor chip 12 is bonded to the heat sink 13 with a conductive adhesive or the like. The heat sink 13 is in contact with a surface 12a of each semiconductor chip 12 on a side opposite to the multilayer substrate 11. The semiconductor chip 12 and the heat sink 13 are thermally connected. A surface 13a of the heat sink 13 on a side opposite to the semiconductor chip 12 is in contact with the electromagnetic shield film 14. The contact surface 7a is a surface of the electromagnetic shield film 14 on a side opposite to the heat sink 13.

The mold resin 15 is a resin that covers peripheries of the semiconductor chips 12 and the heat sinks 13 on the multilayer substrate 11. The electromagnetic shield film 14 is a conductive film such as electroless plating film or a conductive adhesive. The electromagnetic shield film 14 is in contact with each heat sink 13 and covers side surfaces 11a of the multilayer substrate 11 and the mold resin 15. The side surfaces 11a are end surfaces in the X-axis direction and end surfaces in the Y-axis direction of the multilayer substrate 11. The electromagnetic shield film 14 covers the semiconductor chips 12, the heat sinks 13, and the mold resin 15 on the multilayer substrate 11 from the side surfaces 11a, thereby forming a package that seals the semiconductor chips 12. Heat generated in the semiconductor chips 12 propagates to the cooling plate 5 through the heat sinks 13, the contact surface 7a of the microwave device 7, and the heat dissipation sheet 8.

With the microwave device 7 having the above configuration, one side of the package in the Z-axis direction serves as an electrical interface of the microwave device 7. Additionally, the other side of the package in the Z-axis direction serves as a thermal interface of the microwave device 7. As described above, in the microwave device 7, the electrical interface and the thermal interface are separated from each other in the Z-axis direction.

The separation between the thermal interface and the electrical interface in the Z-axis direction allows the microwave device 7 to have a short heat transfer path from the semiconductor chip 12. Thus, with the microwave device 7 having the above configuration, the microwave module 2 enables efficient heat dissipation. The microwave module 2, which enables the efficient heat dissipation, can achieve high output.

The electromagnetic shield film 14 is electrically connected to ground patterns 11c of the multilayer substrate 11. The ground patterns 11c are connected to the ground terminals 7b via ground via holes 11b of the multilayer substrate 11. The ground terminals 7b are provided in each microwave device 7 of the microwave module 2. With such a configuration, the microwave device 7 can suppress the radiation of the microwave signal from the inside of the package to the outside of the package.

The microwave module 2 includes the microwave module substrate 3 disposed perpendicular to the antenna surface 6, in which the respective microwave devices 7 are mounted on the mounting surface 3a, perpendicular to the antenna surface 6, of the microwave module substrate 3. Since the mounting surface 3a is perpendicular to the antenna surface 6, the microwave module 2 can be reduced in size in the direction of the antenna surface 6 irrespective of the area of the semiconductor chips 12 occupying the mounting surface 3a. The microwave module 2 can easily be reduced in size in the direction of the antenna surface 6 as compared with a case where the mounting surface 3a is parallel to the antenna surface 6. Since the microwave module 2 can be reduced in size in the direction of the antenna surface 6, mountability of the microwave module 2 on the antenna 1 can be improved.

Without making the offset of the position of the microwave modules 2 with respect to the position of the antenna elements 4, the antenna 1 enables arraying the microwave modules 2 at an interval equal to or less than the interval at which the antenna elements 4 are arrayed. Even when the frequency of the microwave is high, for example, a frequency band is, for example, Ku band or higher, the antenna 1 achieves the arrangement of the microwave modules 2 without making the offset of the position of the microwave modules 2.

Since the antenna 1 eliminates the offset of the position of the microwave modules 2 with respect to the position of the antenna elements 4, the antenna 1 can avoid a problem, such as an increase in power loss or noise, in the wires between the microwave modules 2 and the antenna elements 4. The antenna 1, which achieves power loss reduction and noise reduction, can obtain high electrical performance.

Additionally, the antenna 1 can avoid a problem that an offset amount of the microwave modules 2 changes in accordance with a change in the array size of the antenna elements 4. The antenna 1 can easily conform to a scalable design, and minimize design changes in accordance with a change in the array size.

According to the first embodiment, in the microwave module 2, the mounting surface 3a of the microwave module substrate 3 is perpendicular to the antenna surface 6, and the plurality of microwave devices 7 are mounted on the mounting surface 3a. Consequently, the microwave module 2 has an effect capable of achieving a reduction in size in the direction of the antenna surface 6.

The configurations described in the above embodiment are an example of the contents of the present disclosure. The configurations of the above embodiment may be combined with another known technique. Some of the configurations of the above embodiment may be omitted or changed without departing from the gist of the present disclosure.

REFERENCE SIGNS LIST 1 antenna; 2 microwave module; 3 microwave module substrate; 3a mounting surface; 3b, 11b ground via hole; 4 antenna element; 5 cooling plate; 6 antenna surface; 7 microwave device; 7a contact surface; 7b ground terminal; 8 heat dissipation sheet; 11 multilayer substrate; 11a side surface; 11c ground pattern; 12 semiconductor chip; 12a, 13a surface; 13 heat sink; 14 electromagnetic shield film; 15 mold resin.

The invention claimed is:

1. An antenna comprising:
a plurality of microwave modules;
a plurality of antenna elements; and
a cooling plate sandwiched between a first microwave module and a second microwave module that are the microwave modules facing each other among the plurality of microwave modules, wherein
each of the plurality of microwave modules includes:
a plurality of microwave devices each configured to exchange a signal with a corresponding one of the plurality of antenna elements; and
a microwave module substrate including a mounting surface on which the plurality of microwave devices are mounted, and being electrically connected to each of the plurality of antenna elements, wherein
the plurality of antenna elements of the plurality of microwave modules are arrayed on a common plane surface, and
the mounting surface of each of the plurality of microwave modules is perpendicular to the common plane surface, wherein
each of the plurality of microwave devices includes:
a multilayer substrate;
a semiconductor element mounted on the multilayer substrate;
a heat sink in contact with a surface of the semiconductor element on a side opposite to the multilayer substrate;
a mold resin covering peripheries of the semiconductor element and the heat sink;
an electromagnetic shield film that is in contact with the heat sink and is configured to cover a side surface of the multilayer substrate and the mold resin; and
a ground terminal electrically connected to the electromagnetic shield film, wherein
the cooling plate is provided between the plurality of microwave devices of the first microwave module and the plurality of microwave devices of the second microwave module.

* * * * *